United States Patent
Jou et al.

(10) Patent No.: US 9,876,008 B2
(45) Date of Patent: Jan. 23, 2018

(54) BANDGAP REFERENCE CIRCUIT

(71) Applicant: TAIWAN SEMICONDUCTOR MANUFACTURING COMPANY, LTD., Hsinchu (TW)

(72) Inventors: Chewn-Pu Jou, Hsinchu (TW); Chien-Jung Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 72 days.

(21) Appl. No.: 14/458,994

(22) Filed: Aug. 13, 2014

(65) Prior Publication Data

US 2016/0049912 A1    Feb. 18, 2016

(51) Int. Cl.
*H01L 27/02* (2006.01)
*H01L 27/06* (2006.01)
*H01L 29/78* (2006.01)
*H01L 27/07* (2006.01)

(52) U.S. Cl.
CPC ...... *H01L 27/0617* (2013.01); *H01L 27/0722* (2013.01); *H01L 29/78* (2013.01); *H01L 29/7838* (2013.01)

(58) Field of Classification Search
CPC ....... G05F 3/30; G05F 1/468; H01L 27/0266; H01L 23/62; H03F 1/301
See application file for complete search history.

(56) References Cited

U.S. PATENT DOCUMENTS

| | | | | |
|---|---|---|---|---|
| 6,222,353 B1* | 4/2001 | Pattamatta | ............... | G05F 1/465 323/269 |
| 6,582,997 B1* | 6/2003 | Lee | ............... | H01L 27/0266 438/208 |
| 6,630,719 B2* | 10/2003 | Roche | ............... | H01L 27/11 257/298 |
| 6,885,179 B1* | 4/2005 | Ker | ............... | G05F 3/30 323/316 |
| 2003/0030482 A1* | 2/2003 | Mori | ............... | G05F 3/247 327/540 |
| 2004/0089909 A1* | 5/2004 | Lee | ............... | H01L 29/87 257/491 |
| 2012/0080716 A1* | 4/2012 | Ker | ............... | H01L 27/0262 257/107 |
| 2013/0292771 A1* | 11/2013 | Zheng | ............... | H01L 27/0255 257/355 |

(Continued)

*Primary Examiner* — Bradley K Smith
*Assistant Examiner* — David Goodwin
(74) *Attorney, Agent, or Firm* — Hauptman Ham, LLP

(57) ABSTRACT

An integrated circuit comprises a first doped region and a second doped region in a substrate. The second doped region is separated from the first doped region by a first spacing. The integrated circuit further comprises a dielectric layer over the substrate and a gate over the dielectric layer. The gate is positioned having the first doped region on a first substrate side of the gate and the second doped region on a second substrate side of the gate opposite the first substrate side of the gate. The integrated circuit also comprises a third doped region in the substrate separated from the first doped region by a second spacing. The integrated circuit further comprises a fourth doped region in the substrate. The gate and the third doped region are coupled with a first voltage supply, and the fourth doped region is coupled with a second voltage supply.

20 Claims, 2 Drawing Sheets

(56) References Cited

U.S. PATENT DOCUMENTS

| | | | |
|---|---|---|---|
| 2015/0048879 A1* | 2/2015 | Fung | G05F 3/30 327/539 |
| 2015/0084108 A1* | 3/2015 | Saha | H01L 21/823807 257/314 |
| 2015/0185746 A1* | 7/2015 | Wang | G05F 3/30 323/313 |
| 2015/0185753 A1* | 7/2015 | Wang | G05F 3/16 323/313 |
| 2015/0207497 A1* | 7/2015 | Lee | H03K 5/003 327/307 |

* cited by examiner

BANDGAP REFERENCE CIRCUIT

BACKGROUND

Some voltage reference circuits, such as bandgap reference circuits, operate at very low voltages and currents. Some reference circuits include complementary metal-oxide-semiconductor (CMOS) transistors that have gates through which a current flows. The low voltages and currents require the CMOS transistors to have high resistance in order to satisfy Ohm's Law (i.e., V=IR). For example, if a reference circuit has a base emitter voltage of 30 millivolts (mV) and a current of 3 nano Amps (nA) that flow through a gate of a CMOS transistor, to satisfy Ohm's law the CMOS transistor has a resistance of 10 mega Ohms (MΩ).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
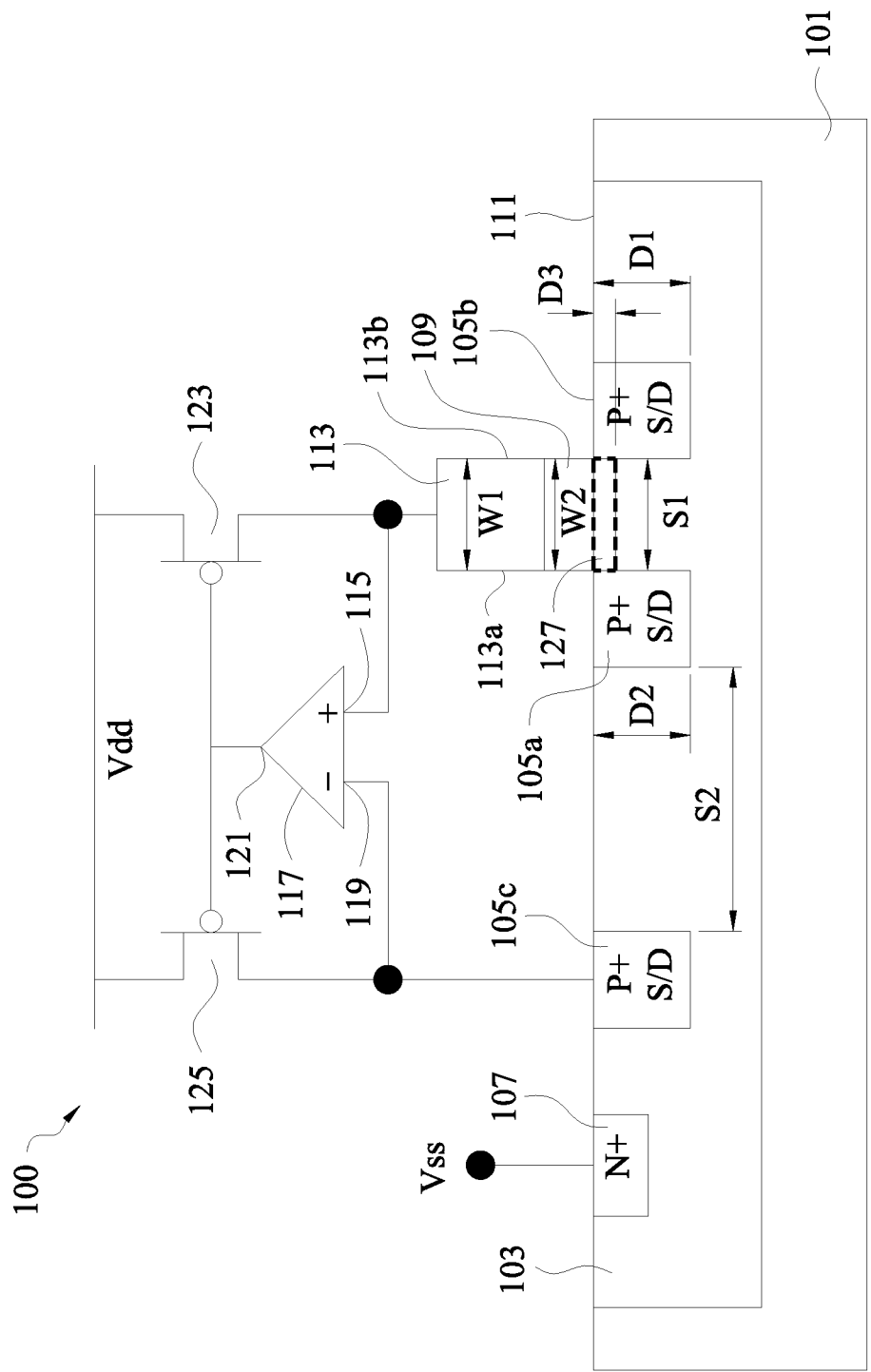
FIG. 1 is a diagram of an integrated circuit, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To satisfy Ohm's law, a complementary metal-oxide-semiconductor (CMOS) reference circuit that operates at very low voltages and currents, such as 30 mV and 3 nA, must have a poly resistance in the CMOS transistor of 10 MΩ. Some CMOS technologies have a gate poly resistance of about 500 Ω per unit square area of gate material. To achieve 10 MΩ of resistance, the example CMOS transistor would require a quantity of 20,000 squares of poly gate material resulting in total greater than 300 μm² area.

As demand for low power consumption and decreased device size increases, a CMOS reference circuit that requires 20,000 squares of poly gate material to achieve 10 MΩ of resistance requires too large of an area for many applications. Further, to form a CMOS transistor that has more than a 500 Ω resistance per square with a cross-sectional area of 300 μm² of poly gate material, the manufacturing process uses multiple masking steps, which reduces production efficiency and increases manufacturing costs.

FIG. 1 is a diagram of an integrated circuit 100 according to an embodiment. Integrated circuit 100 is a bandgap reference circuit having a resistance level ranging from 1 MΩ~10 MΩ at low voltages and currents. Compared to other CMOS reference circuits that would normally require 20,000 squares of poly gate material to achieve 1 MΩ~10 MΩ resistance levels, integrated circuit 100 is more than 60% smaller in area, while still achieving at least 1 MΩ~10 MΩ resistance levels.

Integrated circuit 100 comprises a substrate 101 having a well region 103, and a first doped region 105a in the well region 103. Well region 103 also has a second doped region 105b. The second doped region 105b is horizontally separated from the first doped region 105a by a first spacing S1. In some embodiments, the spacing S1 is a distance that ranges from about 10 nm to about 1 um. Further, well region 103 also has a third doped region 105c. The third doped region 105c is horizontally separated from the first doped region 105a by a second spacing S2. In some embodiments, the spacing S2 is a distance that ranges from about 50 nm to about 1 um. A fourth doped region 107 is in the well region 103. A dielectric layer 109 is over the substrate 101. The dielectric layer 109 is over the substrate 101 and contacts a surface 111 of the substrate 101 extending between the first doped region 105a and the second doped region 105b. In some embodiments the dielectric layer 109 has a thickness that ranges from about 0.1 nA to about 10 nm.

A gate layer 113 is over the dielectric layer 109. The gate layer 113 is positioned having the first doped region 105a in the substrate 101 on a first substrate side 113a of the gate layer 113, and the second doped region 105b is in the substrate 101 on a second substrate side 113b of the gate layer 113 opposite the first substrate side 113a of the gate layer 113. The gate layer 113 is coupled with a first input 115 of an operational amplifier 117. The third doped region 105c is coupled with a second input 119 of the operational amplifier 117. The gate layer 113 and an output 121 of the operational amplifier 117 are coupled with a first transistor 123. The third doped region 105c and the output 121 of the operational amplifier 117 are coupled with a second transistor 125. The first transistor 123 and the second transistor 125 are coupled with a first voltage supply Vdd. The fourth doped region 107 is coupled with a second voltage supply Vss. The gate layer 113, the operational amplifier 117, and the third doped region 105c are coupled with the first voltage supply Vdd by way of the first transistor 123 and the second transistor 125. The first voltage supply Vdd, for example, is a drain voltage and the second voltage Vss is a source voltage.

Substrate 101 comprises a semiconductor material such as a silicon, a silicon-on-insulator, or other suitable material. The dielectric layer 109 is an oxide or other suitable material. The gate layer 113 comprises a polymer material, a polysilicon material, or other suitable material.

The first doped region 105a, the second doped region 105b, and the third doped region 105c have a first doping type. The fourth doped region 107 has a second doping type different from the first doping type. In some embodiments, the first doping type is p-type and the second doping type is n-type. In other embodiments, the first doping type is n-type and the second doping type is p-type. The well region 103 has the second doping type. The first doped region 105a, the second doped region 105b and the third doped region 105c are, for example, source/drain regions.

In some embodiments, the first doped region 105a is optionally coupled with the second doped region 105b by an optional fifth doped region 127. The fifth doped region 127 has the first doping type. The first doped region 105a, the second doped region 105b, and/or the third doped region 105c have a first doping concentration. The optional fifth doped region 127 has a second doping concentration different from the first doping concentration. In some embodiments, the optional fifth doped region 127 has the first doping concentration. For example, if the first doping type is p-type, the first doping concentration is P+, meaning that a region having a doping concentration of P+ is a more heavily doped region compared to a region having a standard p-type doping. The fourth doped region 107 has a doping concentration greater than a doping concentration of the well region 103. For example, if the second doping type is n-type, the fourth doped region 107 has an N+ doping concentration while the well region has a standard n-type doping.

The gate layer 113 has a width W1 in a horizontal direction. The width W1 of the gate layer 113 is equal to the first spacing S1. In some embodiments, the width W1 is greater than the first spacing S1. In other embodiments, the width W1 is less than the first spacing S1. The dielectric layer 109 has a width W2 in a horizontal direction. The width W2 of the dielectric layer 109 is equal to the width W1 of the gate layer 113. In some embodiments, the width W2 of the dielectric layer 109 is less than the width W1 of the gate layer 113. In some embodiments, the width W2 of the dielectric layer 109 is greater than the width W1 of the gate layer 113. In some embodiments, the width W2 of the dielectric layer 109 is equal to the first spacing S1. In some embodiments, the width W2 of the dielectric layer 109 is greater than the first spacing S1. In some embodiments, the width W2 of the dielectric layer 109 is less than the first spacing S1.

The first doped region 105a extends from the surface 111 of the substrate 101 to a first depth D1 from the surface 111 of the substrate 101. The second doped region 105b extends from the surface 111 of the substrate 101 to a second depth D2 from the surface 111 of the substrate 101. The first depth D1 is equal to the second depth D2. In some embodiments, the first depth D1 is greater than or less than the second depth D2. The optional fifth doped region 127 extends from the surface 111 of the substrate 101 to a third depth D3 from the surface 111 of the substrate 101. The third depth D3 is different from the first depth D1 and the second depth D2. In some embodiments, the third depth D3 is less than the first depth D1 and the second depth D2.

In some embodiments, by including the dielectric layer 109, fewer masks are used when manufacturing the integrated circuit 100 as compared to a reference circuit that would attempt to achieve a 10 MΩ resistance without having a gate dielectric or oxide layer such as dielectric layer 109. Because integrated circuit 100 includes the dielectric layer 109, integrated circuit 100 has the capability of consuming less than 10 nano Watts (nW) of power when in use.

Figure 2:
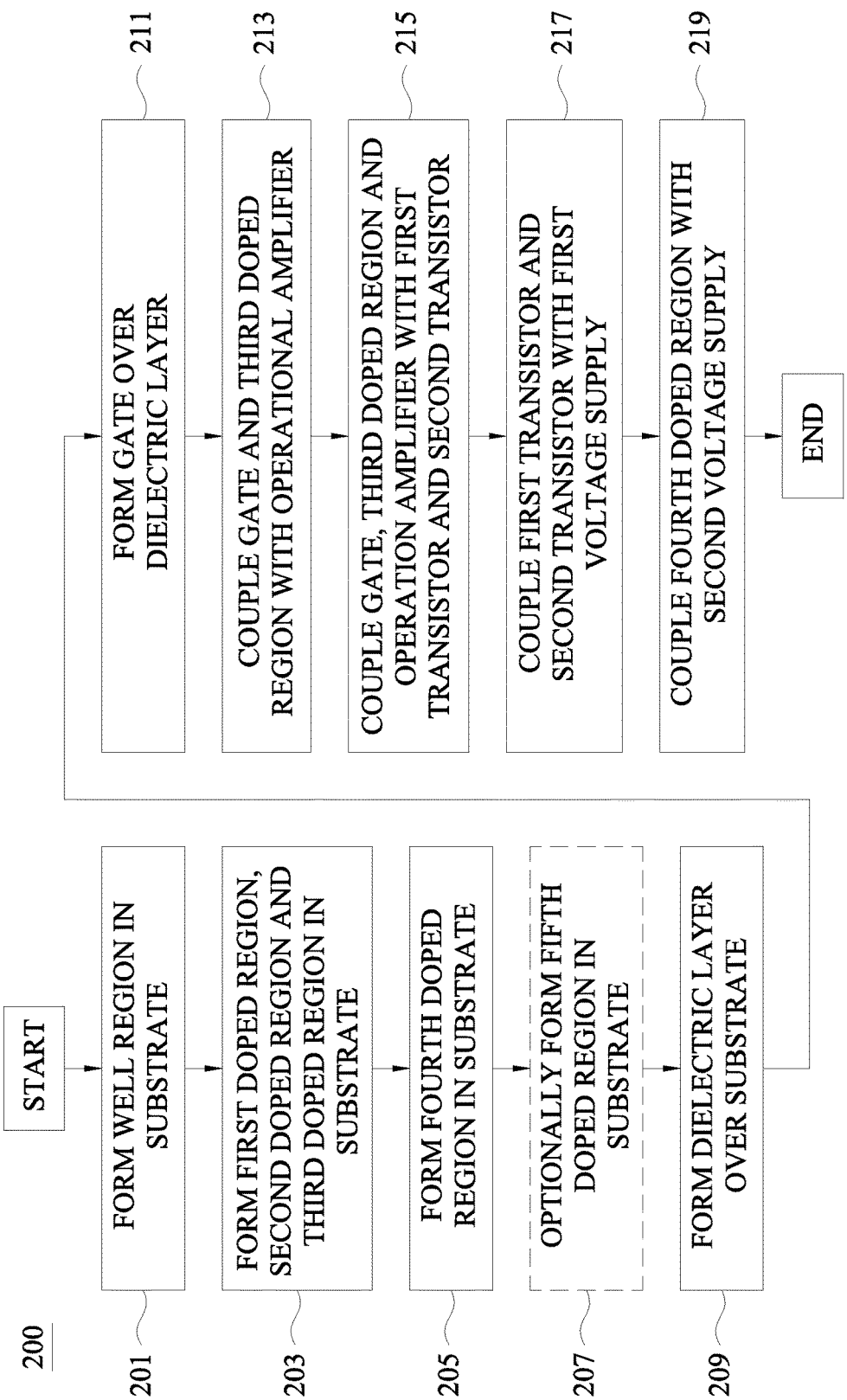
FIG. 2 is a flowchart of a method of forming an integrated circuit, in accordance with one or more embodiments.

FIG. 2 is a flowchart of a method 200 of forming an integrated circuit, in accordance with one or more embodiments.

In step 201, a well region such as well region 103 (FIG. 1) is formed in a substrate such as substrate 101 (FIG. 1) by, for example, an ion implantation process or other suitable process.

In step 203, a first doped region such as first doped region 105a (FIG. 1), a second doped region such as second doped region 105b (FIG. 1) and a third doped region such as third doped region 105c (FIG. 1) are formed in the substrate by, for example, an ion implantation process or other suitable process by, for example, one or more ion implantation processes or other suitable processes. The first doped region and the second doped region are separated by a first spacing, e.g., spacing S1. The first doped region and the third doped region are separated by a second spacing, e.g., spacing S2.

In step 205, a fourth doped region such as fourth doped region 107 (FIG. 1) is formed in the substrate by, for example, an ion implantation process or other suitable process.

In step 207, an optional fifth doped region such as fifth doped region 127 (FIG. 1) is formed in the substrate using an implantation process or other suitable process. The fifth doped region is formed coupling the first doped region with the second doped region.

In step 209, a dielectric layer such as dielectric layer 109 (FIG. 1) is formed over the substrate using physical vapor deposition (PVD), chemical vapor deposition (CVD), epitaxial growth, or other suitable process. In some embodiments, the dielectric layer is deposited or grown over the substrate and etched to have a predetermined width and/or position over the substrate. In other embodiments, the dielectric layer is deposited or grown in a predetermined position having a predetermined width over the substrate.

In step 211, a gate such as gate layer 113 (FIG. 1) is formed over the dielectric layer using low pressure chemical vapor deposition (LPCVD), plasma enhanced chemical vapor deposition (PECVD), or other suitable process. The gate is formed having the first doped region in the substrate positioned on a first substrate side of the gate, and the second doped region in the substrate positioned on a second substrate side of the gate opposite the first substrate side of the gate.

In step 213, the gate and the third doped region are coupled with an operational amplifier such as operational amplifier 117 (FIG. 1) by one or more conductive lines.

In step 215, the gate, the third doped region and the operational amplifier are coupled with a first transistor and a second transistor such as first transistor 123 (FIG. 1) and second transistor 125 (FIG. 1) by one or more conductive lines.

In step 217, the first transistor and the second transistor are coupled with a first voltage supply such as first voltage supply Vdd (FIG. 1) by one or more conductive lines, thereby coupling the gate, the third doped region and the operation amplifier with the first voltage supply.

In step 219, the fourth doped region is coupled with a second voltage supply different from the first voltage supply such as second voltage supply Vss (FIG. 1) by one or more conductive lines.

An aspect of this description relates to an integrated circuit comprising a first doped region in a substrate. The integrated circuit also comprises a second doped region in the substrate, the second doped region being separated from the first doped region by a first spacing. The integrated circuit further comprises a dielectric layer over the substrate. The integrated circuit additionally comprises a gate over the dielectric layer, the gate positioned having the first doped region in the substrate on a first substrate side of the gate, and the second doped region is in the substrate on a second substrate side of the gate opposite the first substrate side of the gate. The integrated circuit also comprises a third doped region in the substrate, the third doped region being separated from the first doped region by a second spacing. The integrated circuit further comprises a fourth doped region in the substrate. The gate and the third doped region are coupled with a first voltage supply, and the fourth doped region is coupled with a second voltage supply different from the first voltage supply.

Another aspect of this description relates to a bandgap reference circuit comprising a first p-doped region in a substrate. The bandgap reference circuit also comprises a second p-doped region in the substrate, the second p-doped region being separated from the first p-doped region by a first spacing. The bandgap reference circuit further comprises a dielectric layer over the substrate. The bandgap reference circuit additionally a gate over the dielectric layer, the gate positioned having the first p-doped region in the substrate on a first substrate side of the gate, and the second p-doped region is in the substrate on a second substrate side of the gate opposite the first substrate side of the gate. The bandgap reference circuit also comprises a third p-doped region in the substrate, the third p-doped region being separated from the first p-doped region by a second spacing. The bandgap reference circuit further comprises an n-doped region in the substrate. The gate and the third p-doped region are coupled with a first voltage supply, and the n-doped region is coupled with a second voltage supply different from the first voltage supply.

A further aspect of this description relates to a method of forming an integrated circuit. The method comprises forming a first doped region in a substrate. The method also comprises forming a second doped region in the substrate, the second doped region being formed with a first spacing separating the first doped region from the second doped region. The method further comprises forming a dielectric layer over the substrate. The method additionally comprises forming a gate over the dielectric layer, the gate being formed having the first doped region in the substrate positioned on a first substrate side of the gate, and the second doped region is in the substrate positioned on a second substrate side of the gate opposite the first substrate side of the gate. The method also comprises forming a third doped region in the substrate, the third doped region being formed with a second spacing separating the first doped from the third doped region. The method further comprises forming a fourth doped region in the substrate. The method additionally comprises coupling the gate and the third doped region with a first voltage supply. The method also comprises coupling the fourth doped region with a second voltage supply different from the first voltage supply.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first doped region in a substrate, the first doped region having a first doping type;
   a second doped region in the substrate, the second doped region being separated from the first doped region by a first spacing;
   a dielectric layer over the substrate;
   a gate over the dielectric layer, the gate positioned having the first doped region in the substrate on a first substrate side of the gate, and the gate positioned having the second doped region in the substrate on a second substrate side of the gate opposite the first substrate side of the gate;
   a third doped region in the substrate, the third doped region being separated from the first doped region by a second spacing; and
   a fourth doped region in the substrate, the fourth doped region having a second doping type different from the first doping type,
   wherein
   the gate is coupled with a first voltage supply by a first conductive line, the third doped region is coupled with the first voltage supply by a second conductive line, and the fourth doped region is coupled by a third conductive line with a second voltage supply different from the first voltage supply, and
   the first doped region, the second doped region, the third doped region, and the fourth doped region are located within a common well region in the substrate, the common well region having a composition different from a composition of the substrate.

2. The integrated circuit of claim 1, wherein the gate has a width equal to the first spacing.

3. The integrated circuit of claim 2, wherein the dielectric layer has a width equal to the width of the gate.

4. The integrated circuit of claim 1, wherein the dielectric layer has a width equal to the first spacing.

5. The integrated circuit of claim 1, further comprising:
   an implant region in the substrate, the implant region connecting the first doped region and the second doped region.

6. The integrated circuit of claim 5, wherein the first doped region extends from a surface of the substrate to a first depth from the surface of the substrate, the second doped region extends from the surface of the substrate to a second depth from the surface of the substrate, and the implant region extends from the surface of the substrate to a third depth from the surface of the substrate, the third depth being different from the first depth and the second depth.

7. The integrated circuit of claim 1, further comprising:
   an operational amplifier coupled with the gate, the third doped region and the first voltage supply.

8. The integrated circuit of claim 7, further comprising:
   a first transistor coupled with the gate and the first voltage supply; and
   a second transistor coupled with the third doped region and the first voltage supply.

9. The integrated circuit of claim 1, wherein the second doped region and the third doped region have the first doping type.

10. The integrated circuit of claim 9, wherein the first doped region and the second doped region are coupled by a fifth doped region having the first doping type.

11. The integrated circuit of claim 10, wherein the first doped region and the second doped region have a first doping concentration, and the fifth doped region has a second doping concentration different from the first doping concentration.

12. The integrated circuit of claim 1, wherein
    the common well region has the second doping type, and
    the fourth doped region has a doping concentration greater than a doping concentration of the common well region.

13. The integrated circuit of claim 1, wherein the first voltage supply is a drain voltage and the second voltage supply is a source voltage.

14. A bandgap reference circuit, comprising:
a first p-doped region in a substrate;
a second p-doped region in the substrate, the second p-doped region being separated from the first p-doped region by a first spacing;
a dielectric layer over the substrate;
a gate over the dielectric layer, the gate positioned having the first p-doped region in the substrate on a first substrate side of the gate, and the gate positioned having the second p-doped region in the substrate on a second substrate side of the gate opposite the first substrate side of the gate;
a third p-doped region in the substrate, the third p-doped region being separated from the first p-doped region by a second spacing; and
an n-doped region in the substrate,
wherein
the gate is coupled with a first voltage supply by a first conductive line, the third p-doped region is coupled with the first voltage supply by a second conductive line, and the n-doped region is coupled by a third conductive line with a second voltage supply different from the first voltage supply, and
the first p-doped doped region, the second p-doped doped region, the third p-doped doped region, and the n-doped region are located within a common, n-doped well region.

15. The integrated circuit of claim 14, wherein the gate has a width equal to the first spacing, and the dielectric layer has a width equal to the width of the gate.

16. The integrated circuit of claim 14, further comprising:
a p-doped implant region in the substrate, the p-doped implant region connecting the first p-doped region and the second p-doped region.

17. The integrated circuit of claim 14, further comprising:
an operational amplifier coupled with the gate, the third p-doped region and the first voltage supply.

18. An integrated circuit, comprising:
a well region in a substrate;
a first doped region in the well region;
a second doped region in the well region, the second doped region being separated from the first doped region by a first spacing;
a dielectric layer over the well region and contacting a surface of the substrate extending between the first doped region and the second doped region;
a gate over the dielectric layer; and
a third doped region in the well region, the third doped region being separated from the first doped region by a second spacing; and
wherein
the gate is coupled with a first voltage supply by a first conductive line, the third doped region is coupled with the first voltage supply by a second conductive line, and the well region is coupled by a third conductive line with a second voltage supply different from the first voltage supply, and
the first doped region, the second doped region, and the third doped region have a same first doping type, and
the well region has a second doping type different from the first doping type.

19. The integrated circuit of claim 18, further comprising an implant region under the dielectric layer, the implant region connecting the first doped region and the second doped region.

20. The integrated circuit of claim 18, further comprising:
an operational amplifier coupled with the gate, the third doped region, and the first voltage supply;
a first transistor coupled with the gate and the first voltage supply; and
a second transistor coupled with the third doped region and the first voltage supply.

* * * * *